United States Patent
Barnola et al.

(10) Patent No.: US 8,669,188 B2
(45) Date of Patent: Mar. 11, 2014

(54) METHOD FOR MAKING A PATTERN FROM SIDEWALL IMAGE TRANSFER

(75) Inventors: Sebastien Barnola, Villard-Bonnot (FR); Jerome Belledent, Crolles (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 21 days.

(21) Appl. No.: 13/301,251

(22) Filed: Nov. 21, 2011

(65) Prior Publication Data

US 2012/0132616 A1    May 31, 2012

(30) Foreign Application Priority Data

Nov. 30, 2010  (FR) ...................................... 10 04655

(51) Int. Cl.
*H01L 21/302*    (2006.01)

(52) U.S. Cl.
USPC .............. 438/736; 438/717; 438/737; 216/47

(58) Field of Classification Search
USPC ......... 438/639, 706, 717, 725, 736, 737, 751; 216/41, 46, 47; 430/311, 313
See application file for complete search history.

(56) References Cited

U.S. PATENT DOCUMENTS

| | | | |
|---|---|---|---|
| 7,479,429 B2 * | 1/2009 | Rao et al. | 438/261 |
| 2006/0046422 A1 | 3/2006 | Tran et al. | |
| 2010/0047979 A1 * | 2/2010 | Chien et al. | 438/257 |
| 2010/0291771 A1 | 11/2010 | Zhou et al. | |

* cited by examiner

*Primary Examiner* — Lan Vinh

(74) *Attorney, Agent, or Firm* — Oliff PLC

(57) ABSTRACT

The substrate is provided with a layer of first material, a first etching mask, a covering layer and a second etching mask. The covering layer has a covered main area and an uncovered secondary area. The secondary area of the covering layer is partially etched via the second etching mask to form a salient pattern. Lateral spacers are formed around the salient pattern defining a third etching mask. The second etching mask is eliminated. The covering layer is etched by means of the third etching mask to form a salient pattern in the covering layer and to uncover the first etching mask and the first material. The layer of first material is etched to form the pattern made from the first material.

11 Claims, 6 Drawing Sheets

METHOD FOR MAKING A PATTERN FROM SIDEWALL IMAGE TRANSFER

BACKGROUND OF THE INVENTION

The invention relates to a method for producing a pattern made from a first material.

STATE OF THE ART

The continuous improvement of performances of integrated circuits, for example in terms of consumption and/or operating frequency, is ineluctably resulting in a constant reduction of the size of its components and in an increased density. In order to produce devices with ever-improving performances, new techniques for designing patterns of small dimensions have been instigated.

Reduction of the size of the transistor especially leads to difficulties in large-density definition of the patterns of small dimensions, but also to an increase of the constraints related to alignment of the different photolithographic levels with respect to one another. To form increasingly dense patterns, the photolithography and etching equipment has to be continuously improved. This growing increase in technological constraints on photolithography equipment is no longer compatible with current equipment.

An alternative path for development consists in defining the width and/or length of the required pattern by depositing a masking material. In this way, at least one of the lateral dimensions of the pattern is not defined by photolithography, but by means of deposition of a predefined thickness of masking material.

As illustrated in FIG. 1, a substrate 1 is covered by a layer made from a first material 2, itself covered by a covering layer 3. An etching mask 4 is formed, by any suitable technique, on covering layer 3.

As illustrated in FIG. 2, covering layer 3 is etched, for example by plasma, through etching mask 4 to reproduce the latter in the pattern of etching mask 4.

The etching chemistry is chosen selective with respect to the etching mask and with respect to first material 2 in order to eliminate a part of covering layer 3 without damaging first material 2 or modifying the pattern of etching mask 4.

A loss of selectivity with respect to first material 2 results in particular in degradation of the physical-chemical properties and a reduction of the thickness of first material, which is detrimental to satisfactory accomplishment of the subsequent steps.

The etching chemistry is chosen as anisotropic as possible in order to reproduce the pattern of etching mask 4 faithfully in covering layer 3.

This etching step forms a pattern of covering material 3 defined from the pattern of etching mask 4.

As illustrated in FIG. 3, once covering layer 3 has been patterned, first etching mask 4 is eliminated.

As illustrated in FIG. 4, a masking material 5 is deposited and then etched so as to form one or more lateral spacers. Masking material 5 is deposited in conformal manner and is anisotropically etched so as to localize it on the side walls of the pattern of covering material 3.

The thickness of deposited material defines one of the dimensions of the pattern of masking material 5. This dimension is reduced in the plasma etching step. In this way, the photolithography step defines the position of the patterns and the formation step of the lateral spacers defines at least one of the lateral dimensions of these patterns.

There again, etching of masking material 5 uses a chemistry that is highly anisotropic and selective with respect to first material 2 and to covering material 3.

As illustrated in FIG. 5, once the lateral spacers have been formed, covering material 3 is eliminated and the spacers form a second etching mask 6.

As illustrated in FIG. 6, second etching mask 6, obtained by the Sidewall Image Transfer technique, is covered by a second covering material 7. A third etching mask 8 is formed on second covering material 7.

As illustrated in FIG. 7, second covering material 7 is etched by means of third etching mask 8 until second etching mask 6 and first material 2 are reached.

First material 2 is then etched by means of second etching mask 6 (the spacers made from masking material 5) and of third etching mask 8 as illustrated in FIG. 8 to form a pattern of first material. The design of the pattern of first material 2 corresponds to the combination of the designs of second etching mask 6 and of third etching mask 8.

This implementation method is very difficult to use as it is associated with a large number of technological constraints which are spread over the different steps of the method.

OBJECT OF THE INVENTION

It is observed that there is a need to provide a method for producing a pattern partially defined by Sidewall Image Transfer that is simpler to implement.

This requirement tends to be satisfied by means of a method which comprises the following steps:
providing a substrate provided with a layer of first material covered by a first etching mask, a covering layer and a second etching mask, the covering layer having a main area covered by the second etching mask and an uncovered secondary area, partially etching the secondary area of the covering layer by means of the second etching mask so as to form a salient pattern in the covering layer, depositing and etching a masking material so as to form lateral spacers around the salient pattern defining a third etching mask, eliminating the second etching mask, etching the covering layer by means of the third etching mask so as to form a salient pattern in the covering layer and uncover the first etching mask and the first material, etching the layer of first material by means of the covering layer and of the first etching mask to form the pattern of first material.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 9:
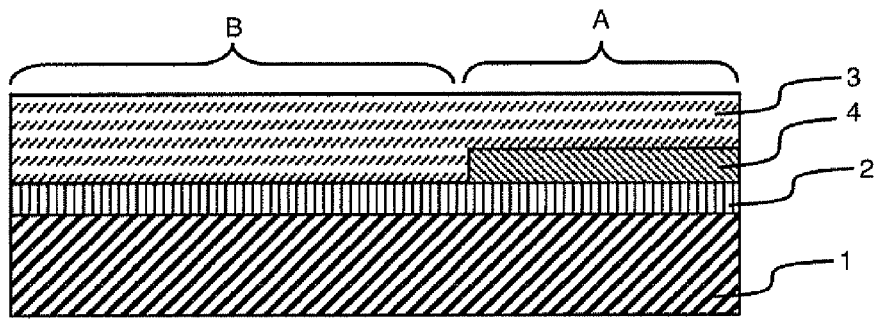

As illustrated in FIG. 9, a substrate 1 comprises a support which is covered by a layer of first material 2. The layer of first material 2 is covered by a first etching mask 4 and covering layer 3.

The support is for example a substrate made from semiconductor material with active components covered by one or more protective layers. The support can also be formed by an electrically conducting or electrically insulating material at the surface of which patterns are to be formed. In advantageous manner, the main surface of the support is formed by one or more layers of electrically insulating material. The main surface of the support is covered by the layer of first material 2.

First material 2 can be electrically insulating or electrically conducting. In advantageous manner, if the substrate is of semiconductor type with insulating layers on its main surface, the first material is electrically conducting, for example made from TiN, BN, TaN, AlN with a thickness advantageously comprised between 10 and 50 nm.

First etching mask 4 is formed on the layer of first material 2. First etching mask 4 defines a main area A and a secondary area B on first material 2.

Main area A is directly covered by first etching mask 4 and secondary area B is directly covered by covering layer 3. The design of etching mask 4 can be of any form and is defined according to the required patterns. First etching mask 4 is arranged between layer of first material 2 and covering layer 3 and prevents direct contact between first material 2 and covering layer 3 in main area A.

First etching mask 4 is for example a silicon oxide, a silicon nitride, a mixture or a stack of the latter. The first etching mask can be formed in another material so long as the nature of its constituents is compatible with its position between first material 2 and covering layer 3.

In advantageous manner, covering layer 3 represents antireflection properties to facilitate subsequent formation of a second etching mask 6. For example purposes, covering material 3 is a carbonaceous material deposited by chemical vapour deposition or by spin-coating. For example, the material used is represented by the formula CxHy which results in a more or less hydrogenated carbon material.

Figure 10:
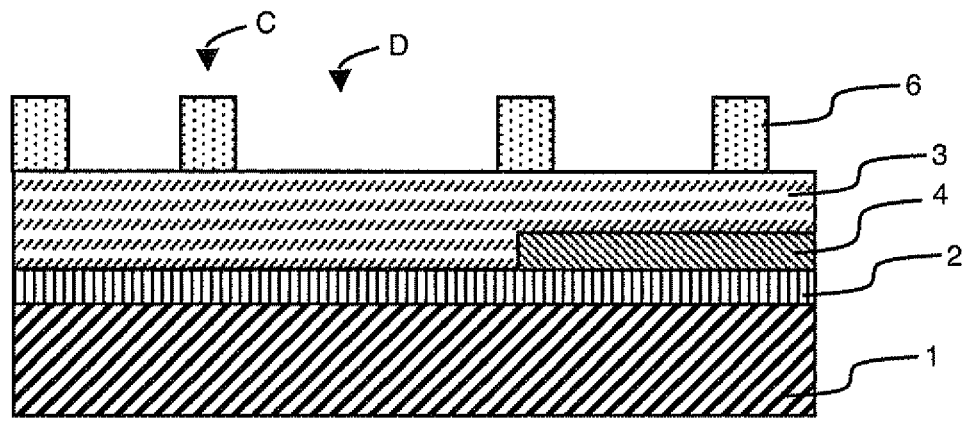

As illustrated in FIG. 10, a second etching mask 6 is formed on covering layer 3. Second etching mask 6 also defines a main area C and a secondary area D on covering layer 3. Main area C is covered by second etching mask 6 and secondary area D is uncovered, and is therefore left free. The design of second etching mask 6 can be of any form and is defined according to the required patterns, with respect to the design of first etching mask 4. First 4 and second 6 etching masks are covered by covering layer 3.

Second etching mask 6 is for example a photoresist or a material of different nature. In certain embodiments, second etching mask 6 is made from silicon oxide, silicon nitride, a stack of the latter or another material. When second etching mask 6 is not a resin, it is advantageous to define its shape by means of a photolithography step followed by an etching step. Second etching mask 6 is also called hard mask.

Figure 11:
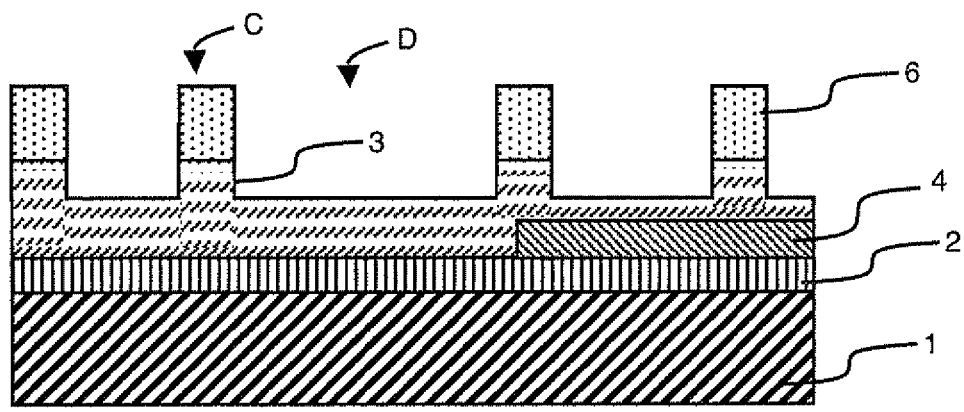

As illustrated in FIG. 11, covering material 3 is etched, by any suitable technique, by means of second etching mask 6. Etching of covering layer 3 is partial. The part of covering material 3 left free is partially etched so as to form a salient pattern in covering layer 3. This partial etching is represented by areas of different thicknesses. In main area C, covered by second etching mask 6, the thickness is unchanged and represents a thick area. In uncovered secondary area D, covering layer 3 has been partially eliminated and this corresponds to a thin area of layer 3.

The design of second etching mask 6 has been reproduced in covering layer 3 through second etching mask 6 and the contour of the design is formed by side walls which are vertical or substantially vertical and which connect the thin area to the thick area. Etching of covering layer 3 being performed only on a part of the thickness of the covering material, the height of the side wall is smaller than the thickness of covering layer 3.

Covering layer 3 is therefore patterned so as to form areas with different thicknesses which results in the presence of salient patterns in the layer of covering material on a continuous film of covering material 3.

In advantageous manner, first material 2 and first etching mask 4 are completely covered by covering layer 3.

In advantageous manner, etching is performed by plasma imposing the etching time or controlling the etching thickness by in-situ reflectometry.

Figure 12:
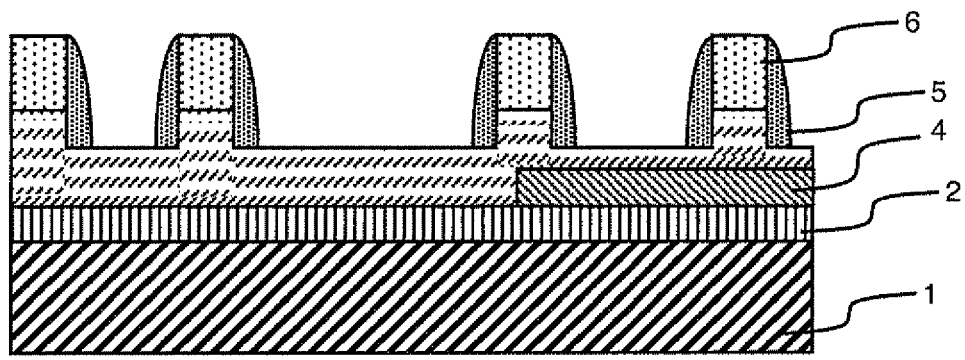

As illustrated in FIG. 12, a masking material 5 is then deposited conformally or as conformally as possible on the assembly and covers covering layer 3 and second etching mask 6. In a conformal deposition, the thickness deposited on the vertical walls is identical to the thickness deposited on the horizontal walls. Once masking material 5 has been deposited, the latter is etched by any suitable technique, preferably with an anisotropic plasma etching, to form the lateral spacers or sidewall spacers (also called "sidewall"). Etching enables masking material 5 to be localized on the vertical walls defined in covering layer 3. In this way, after the etching step, masking material 5 forms lateral spacers which cover the side walls of covering material 3.

Figure 13:
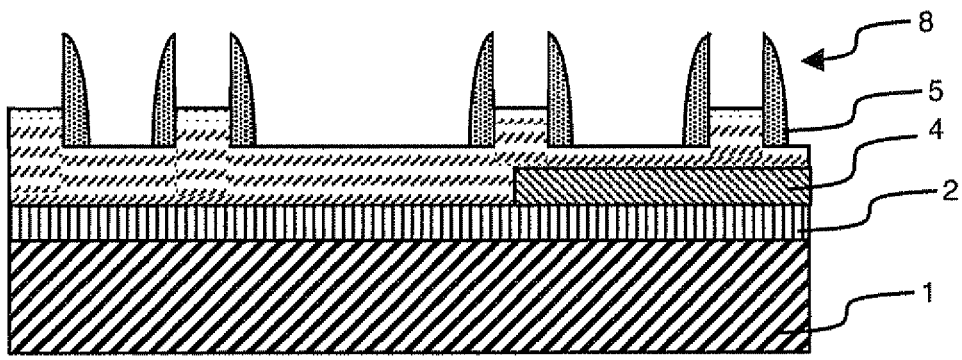

As illustrated in FIG. 13, second etching mask 6 is eliminated to leave covering material 3 and spacers made from masking material 5 at the surface. The spacers made from masking material 5 form a third etching mask 8. The design of third etching mask 8 is partly defined by the design of second etching mask 6 which imposes the position of the lateral spacers. The design of third etching mask 8 is also defined from the thickness of masking material 5 deposited and from the etched thickness to define the lateral spacers.

Figure 14:
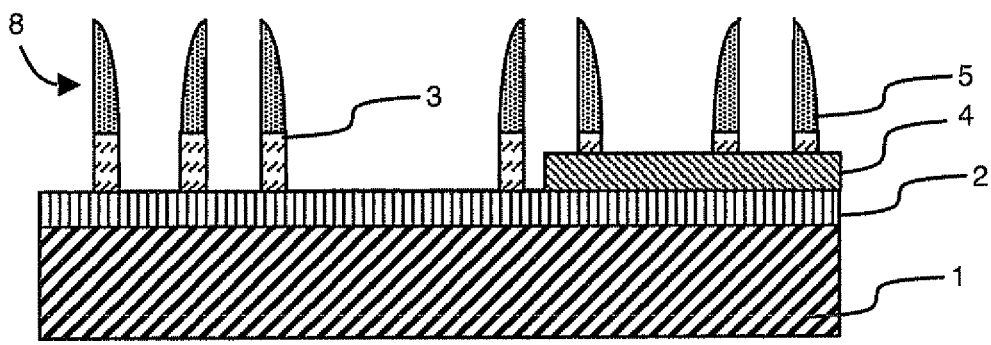

As illustrated in FIG. 14, covering layer 3 is etched by means of a third etching mask 8 so as to form a salient pattern in covering layer 3. In the uncovered areas, i.e. the areas not covered by third etching mask 8, etching is total so as to reach first material 2 or first etching mask 4. Covering material 3 is eliminated under the areas initially covered by second etching mask 6 and in second area D at the places not covered by the lateral spacers.

The patterns of covering material 3 are formed in the thin area, and their thickness was defined when partial etching of covering material 3 was performed. The patterns of covering material 3 reproduce the design of third etching mask 8.

This embodiment is particularly advantageous as it offers a greater flexibility in definition of third etching mask 8. A deposition is never perfectly conformal and an etching is never perfectly anisotropic. This results, in the prior art, in the shape of the lateral spacers being limited by the technological possibilities of the equipment or by the minimum thickness constraints imposed by other technological steps. In the prior art, the thickness of the covering layer gives the height of the lateral spacers.

In the present case, the difference of thickness between the thin area and the thick area and the thickness of second etching mask 6 imposes the height of the lateral spacers. It is then possible to modulate the depth of sinking in covering material 3 to obtain deposition of masking material 5 that enables a deposition that is conformal or as conformal as possible to be obtained. In similar manner, this flexibility in the height of the lateral spacers enables more efficient etching methods to be obtained. Performing partial etching of covering material 3 enables additional degrees of freedom to be obtained in fabricating the lateral spacers with the required shape. The thickness of covering material 3 can thus be chosen independently to minimize reflectivity when lithography is formed.

Performing partial etching of covering layer 3 leaves first material 2 and first etching mask 4 covered by covering layer 3 forming a free flat surface. This also prevents formation of parasite patterns in third etching mask 8. An identical result is obtained by completely etching of covering layer 3 above first etching mask 4 and ensuring that the free surface of first etching mask 4 and of adjacent covering layer 3 form a flat surface in the uncovered areas.

As first etching mask 4 is covered by covering material 3, there is no parasite step between first etching mask 4 and first material 2. Parasite lateral spacers are therefore not formed at the level of this step.

Partial etching of covering material 3 enables the surface inequalities present before deposition of the covering material to be smoothed, for example surface maskwork on substrate 1 and/or on layer of first material 2 and the surface maskwork between first material 2 and first etching mask 4.

The thickness of covering layer 3 is chosen so as to limit the effect of the bottom layers and patterns in the definition step of second etching mask 6. It is then possible to use a covering layer 3 that is thick enough to mask the effect of the bottom layers. The thickness of covering layer 3 is no longer a constraint as it is etched in two steps. The first partial etching enables third etching mask 7 to be defined under the best conditions. The second complete etching enables the final mask to be used for etching first material 2 to be defined.

Figure 1:
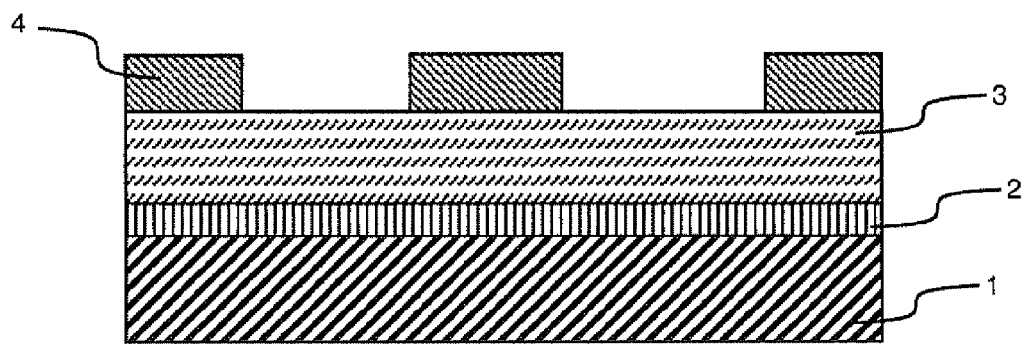
FIGS. 1 to 8 schematically represent successive steps of implementation of a first method, in cross-sectional view, FIGS. 9 to 16 schematically represent successive steps of implementation of a second method, in cross-sectional view, FIG. 17 schematically represents an alternative embodiment with relation to FIG. 12, in cross-sectional view, FIG. 18 schematically represents a cross-sectional view of another alternative embodiment.
Figure 2:
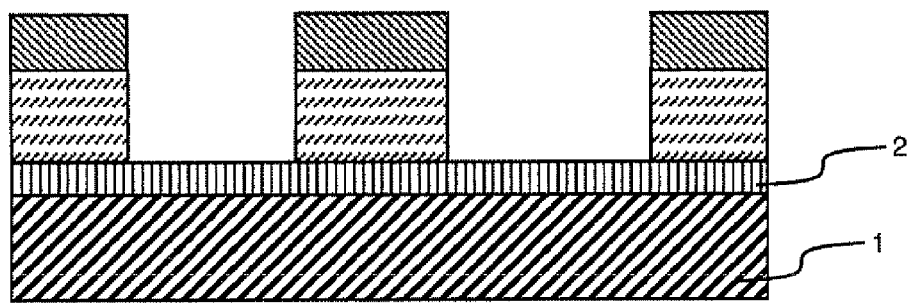
Figure 3:
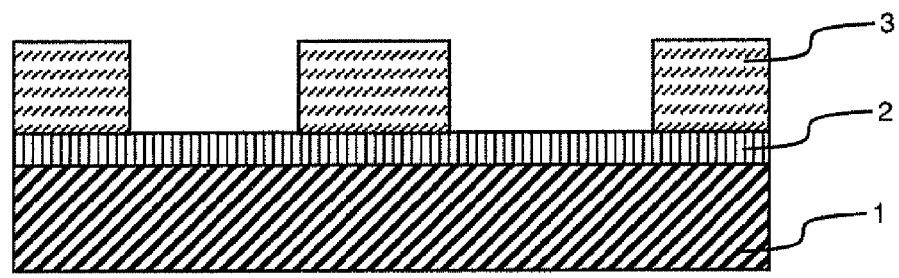
Figure 4:
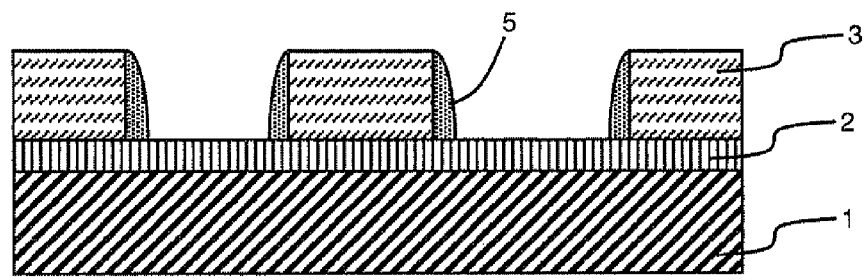
Figure 5:
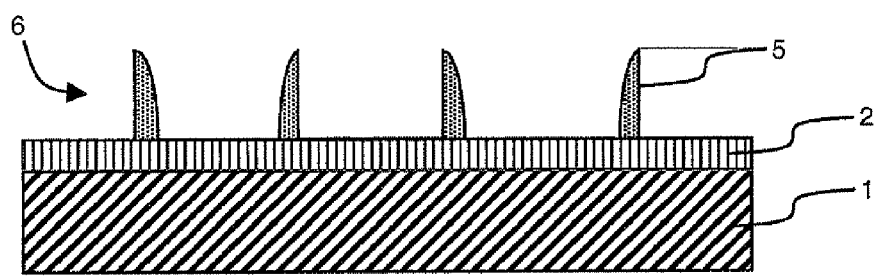
Figure 6:
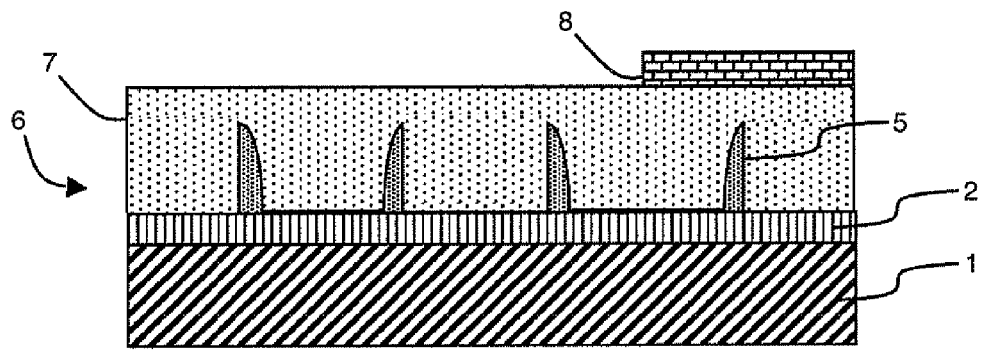
Figure 7:
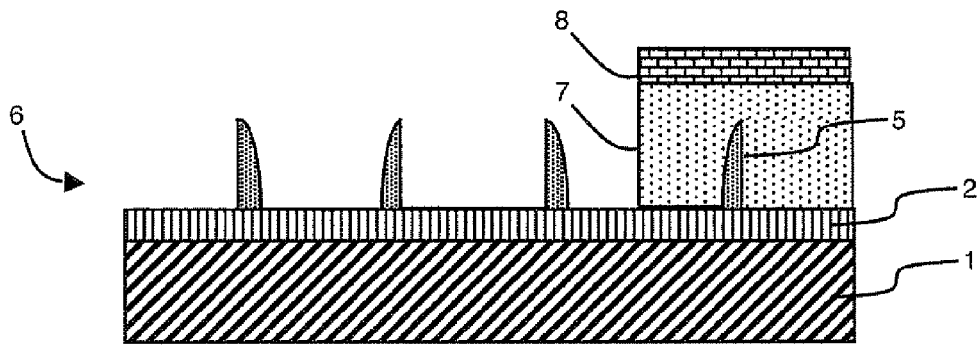
Figure 8:
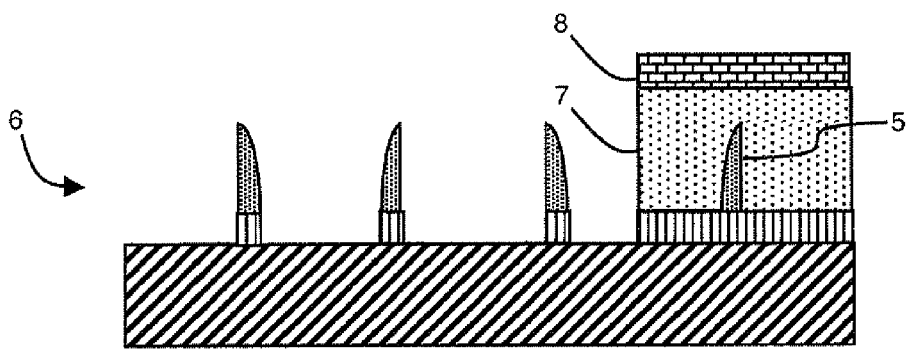

Furthermore, when first etching mask 4 is produced in conventional manner, i.e. by a technique other than Sidewall Image Transfer, patterns having a large width can be obtained. It is then easy to align second etching mask 6 with respect to the first etching mask. In the prior art, first etching mask 4 is obtained with the Sidewall Image Transfer technique which imposes patterns of small size which makes alignment of the subsequent photolithographic levels difficult. Furthermore, the second etching mask which defines the most critical dimensions is made on an important topography, which requires the use of flattening material. This large topography induces disparities of reflectivity for the lithography which are detrimental to obtaining the required resolution. This topography also induces local temperature differences, according to the density of the underlying patterns, which modify the final dimensions of the patterns. Furthermore, the patterns transferred into second covering material 7 (FIG. 7) have a high aspect ratio (ratio between width and height) which results in problems of strength for these patterns.

Unlike the method described, first etching mask 4 which defines the most critical dimensions is made on a surface without topography and presents a smaller thickness than the etching mask formed by the Sidewall Image Transfer technique. The effect of first etching mask 4 on definition of second etching mask 6 is thus reduced.

Figure 15:
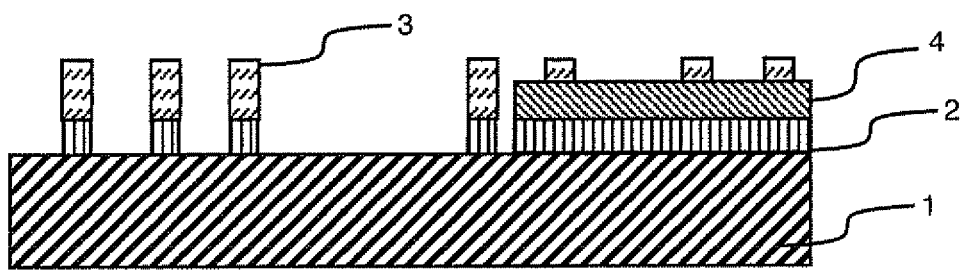

As illustrated in FIG. 15, first etching mask 4 and the pattern formed in the covering layer form a fourth etching mask which is used for etching first material 2. The design of the fourth etching mask corresponds to addition of the solid areas of first etching mask 4 and of third etching mask 8. Differences can exist if etching of the covering material comprises an isotropic component or if a trimming step reduces the size of the patterns or makes the smallest patterns disappear.

Figure 16:
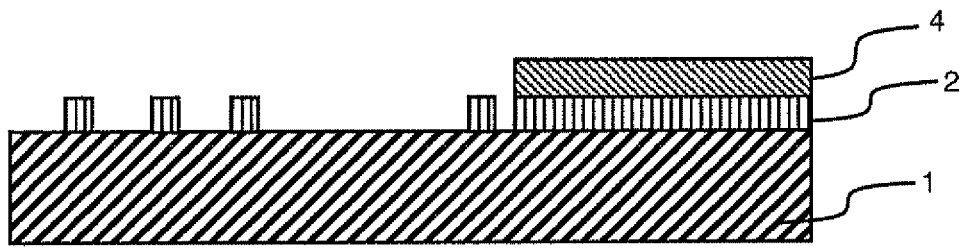

As illustrated in FIG. 16, the pattern of first material 2 is formed through the fourth etching mask and therefore through first etching mask 4 and the pattern of covering material 3.

Figure 17:
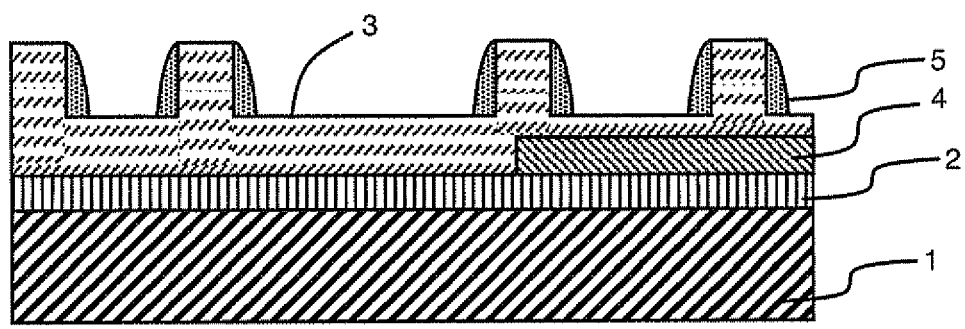

In an alternative embodiment illustrated in FIG. 17, second etching mask 6 is eliminated before masking material 5 is deposited and before the lateral spacers are formed. The height of the lateral spacers is defined from the depth of sinking in covering material 3 which leaves the same margins of operation as in the previous embodiment. This variant is particularly advantageous as it only requires etching selectivity between the material of second etching mask 6 and covering material 3, which relaxes the constraints in the choice of materials.

If second etching mask 6 is eliminated after lateral spacers have been formed, etching selectivity must be ensured not only between the material of second etching mask 6 and covering material 3, but also between the material of second etching mask 6 and masking material 5.

The lateral spacers forming third etching mask 8 are formed in the same manner as before and third etching mask 8 is used as before to etch covering material 3. The final structure is identical to that illustrated in FIG. 16 of the previous embodiment.

In this manner, etching of covering material 3 is performed by means of selective etching of covering material 3 with respect to third etching mask 8. Third etching mask 8 is then selectively eliminated with respect to covering material 3. Masking material 5 is then selectively eliminated with respect to covering material 3 to form the lateral spacers. Finally, covering material 3 is selectively eliminated with respect to masking material 5 to reproduce the design of this third etching mask 8.

This particular embodiment is extremely advantageous as each etching step is performed with a small number of materials. At the surface of the substrate, only the material to be eliminated and the material to be kept are present. There is no material to be eliminated in the presence of two materials to be kept, as is the case in the prior art. This results in greater freedom of choice in the methods that can be used to perform etching and/or in the most robust etching methods.

In advantageous manner, in the thin area and the thick area of covering layer 3, first etching mask 4 is covered by covering material 3. Complete covering of first etching mask 4 by the covering material enables the number of materials visible in the etching step to be limited thereby facilitating development and tuning of an etching chemistry.

In a preferred embodiment, first etching mask 4 is obtained directly by means of a photolithography step followed by an etching step. The design of first etching mask 4 comes directly from the design of a photoresist mask. This direct definition from the design defined by photolithography enables areas of different sizes to be formed easily, advantageously areas having considerably larger dimensions than those defined in third etching mask 8 by the spacers. In this embodiment, an alignment pattern of large size, for example at least a few microns, is formed in first etching mask 4. This large pattern enables easier alignment of the photolithography level of second etching mask 6 with respect to that defined by first etching mask 4. In the prior art, the photolithographic levels are reversed, the etching mask obtained by Sidewall Image Transfer being formed before the etching mask obtained by photolithography. This arrangement of the lithography steps means that a more difficult alignment has to be performed by means of areas with large densities of patterns of small dimensions. This method therefore enables a better alignment of the two photolithographic levels used and/or a more robust alignment method to be obtained.

Figure 18:
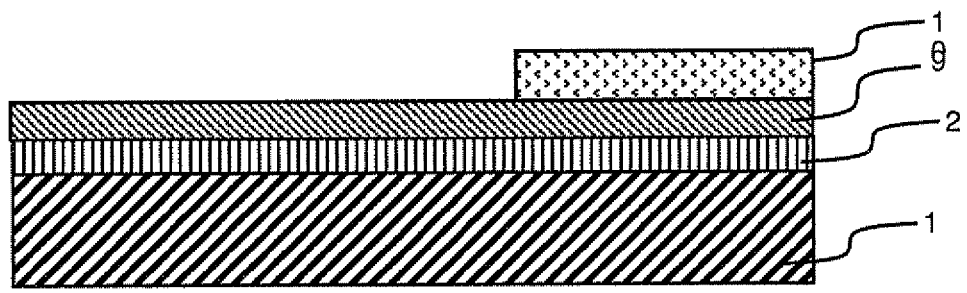

As an example illustrated in FIG. 18, first etching mask 4 is formed in conventional manner. Substrate 1 is provided with the layer of first material 2 covered by an additional masking layer 9 and an additional etching mask 10. An additional covering layer (not shown) can be used to reduce the influence of substrate 1 when additional etching mask 10 is formed. The additional covering layer and the additional masking layer 9 are etched and masking layer 9 forms first etching mask 4. Additional etching mask 10 and the additional covering layer are eliminated to only leave first etching mask 4 at the surface.

In other embodiments, first etching mask 4 can be obtained indirectly from the design of the photolithography level used, for example using Sidewall Image Transfer.

It is also possible to produce additional etching masks by Sidewall Image Transfer after covering material 3 has been etched by means of third etching mask 8. The method is then identical to the one described above considering that what is present on first material 2 is first etching mask 4.

When second etching mask 6 is formed by photolithography on covering material 3, this imposes certain constraints, in particular in the choice of covering material 3 and in the usable thickness. The object of these constraints is to facilitate the photolithography step by reducing the problems of reflectivity and the optic influence of the bottom layers. These constraints have the effect of increasing the thickness of covering layer 3 to facilitate the formation of second etching mask 4. As indicated in the foregoing, covering layer 3 also has to enable definition of the lateral spacers, which limits the range of accessible materials and/or the ranges of usable thickness to obtain a method that is in conformity with the imposed profile.

Etching of covering material 3 over a part of its thickness enables these constraints to be at least partially relaxed. The photolithography step is performed over a certain thickness of covering material 3. This thickness is chosen so as to facilitate the photolithography step. The layer of covering material 3 is then etched to form a thick area and a thin area and this difference of thickness is used to facilitate definition of the lateral spacers with the chosen dimensional ratio. Definition of the spacers is facilitated as a larger choice of materials is accessible, the difficulties to obtain a conformal deposition being partly eradicated by the flexibility in the choice of a difference of thickness between the thin area and the thick area.

The invention claimed is:

1. A method for producing a pattern made from a first material comprising the following steps:
providing a substrate provided with a layer of first material covered by a first etching mask, a covering layer and a second etching mask, the covering layer having a main area covered by the second etching mask and an uncovered secondary area,
partially etching the secondary area of the covering layer by means of the second etching mask so as to form a salient pattern in the covering layer,
forming and etching a masking material so as to form lateral spacers around the salient pattern defining a third etching mask,
eliminating the second etching mask,
etching the covering layer by means of the third etching mask so as to form a salient pattern in the covering layer and to uncover the first etching mask and the first material, and
etching the layer of first material by means of the covering layer and of the first etching mask to form the pattern made from the first material, wherein
the first etching mask has a pattern, the pattern being retained throughout the steps.

2. The method according to claim 1, wherein formation of the first etching mask comprises the following steps:
providing the substrate provided with a layer of first material covered by an additional masking layer and an additional etching mask,
etching the additional masking layer to form the first etching mask, and
eliminating the additional etching mask.

3. The method according to claim 1, wherein the first etching mask defines covered and uncovered areas on a face of the substrate.

4. The method according to claim 1, wherein all the steps occur in succession.

5. A method for producing a pattern made from a first material comprising the successive following steps:
providing a substrate provided with a layer of first material covered by a first etching mask, a covering layer and a second etching mask, the covering layer having a main area covered by the second etching mask and an uncovered secondary area, wherein the first etching mask defines at least one area covered by the first etching mask and one area uncovered by the first etching mask,
partially etching the secondary area of the covering layer by means of the second etching mask so as to form a salient pattern in the covering layer,
eliminating the second etching mask,
forming and etching a masking material so as to form lateral spacers around the salient pattern defining a third etching mask,
etching the covering layer by means of the third etching mask so as to form a salient pattern in the covering layer and to uncover the first etching mask and the first material, and
etching the layer of first material by means of the covering layer and of the first etching mask to form the pattern made from the first material, wherein
the first etching mask has a pattern, the pattern being retained throughout the steps.

6. The method according to claim 5, wherein formation of the first etching mask comprises the following steps:
providing the substrate provided with a layer of first material covered by an additional masking layer and an additional etching mask,
etching the additional masking layer to form the first etching mask, and
eliminating the additional etching mask.

7. The method according to claim 5, wherein the first etching mask defines covered and uncovered areas on a face of the substrate.

8. A method for producing a pattern made from a first material comprising the following steps:
providing a substrate provided with a layer of first material covered by a first etching mask, a covering layer and a second etching mask, the covering layer having a main area covered by the second etching mask and an uncovered secondary area, partially etching the secondary area of the covering layer by means of the second etching mask so as to form a salient pattern in the covering layer, forming and etching a masking material so as to form lateral spacers around the salient pattern defining a third etching mask, eliminating the second etching mask, etching the covering layer by means of the third etching mask so as to form a salient pattern in the covering layer and to uncover the first etching mask and the first material, and etching the layer of first material by means of the covering layer and of the first etching mask to form the pattern made from the first material, wherein all the steps occur in succession.

9. The method according to claim 8, wherein formation of the first etching mask comprises the following steps:

providing the substrate provided with a layer of first material covered by an additional masking layer and an additional etching mask, etching the additional masking layer to form the first etching mask, and eliminating the additional etching mask.

10. The method according to claim 8, wherein the first etching mask defines covered and uncovered areas on a face of the substrate.

11. The method according to claim 8, wherein the first etching mask has a pattern, the pattern being retained throughout the steps.

* * * * *